United States Patent
Tanaka et al.

(10) Patent No.: US 11,569,785 B2
(45) Date of Patent: Jan. 31, 2023

(54) TRANSIMPEDANCE AMPLIFIER

(71) Applicant: Nippon Telegraph and Telephone Corporation, Tokyo (JP)

(72) Inventors: Kenji Tanaka, Tokyo (JP); Naoki Miura, Tokyo (JP); Hiroyuki Fukuyama, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/289,908

(22) PCT Filed: Oct. 18, 2019

(86) PCT No.: PCT/JP2019/041059
§ 371 (c)(1),
(2) Date: Apr. 29, 2021

(87) PCT Pub. No.: WO2020/090519
PCT Pub. Date: May 7, 2020

(65) Prior Publication Data
US 2021/0408973 A1 Dec. 30, 2021

(30) Foreign Application Priority Data
Nov. 2, 2018 (JP) .............................. JP2018-207228

(51) Int. Cl.
| H03F 1/34 | (2006.01) |
| H03F 1/48 | (2006.01) |
| H03F 3/195 | (2006.01) |
| H03F 3/70 | (2006.01) |
| H01F 41/061 | (2016.01) |
| H01F 27/28 | (2006.01) |

(52) U.S. Cl.
CPC ............ *H03F 1/34* (2013.01); *H01F 27/2866* (2013.01); *H01F 41/061* (2016.01); *H03F 1/48* (2013.01); *H03F 3/70* (2013.01)

(58) Field of Classification Search
CPC ..... H03F 1/34; H03F 1/48; H03F 3/70; H03F 1/342; H03F 1/42; H03F 3/195; H01F 27/2866; H01F 41/061; H01F 2027/2809; H01F 19/04; H01F 27/2804
USPC .................................................. 330/86, 308
See application file for complete search history.

(56) References Cited

U.S. PATENT DOCUMENTS

| 10,797,658 B1* | 10/2020 | Raj ....................... H03F 3/3022 |
| 2015/0229281 A1* | 8/2015 | Jiang .................... H04B 10/693 |
| | | 398/202 |

OTHER PUBLICATIONS

Chao, et al.," A DC-11.5 GHz Low-Power, Wideband Amplifier Using Splitting-Load Inductive Peaking Technique," IEEE Microwave and Wireless Components Letters, vol. 18, No. 7, Jul. 2008, 3 pages. As discussed in Specification.

(Continued)

*Primary Examiner* — Hieu P Nguyen
(74) *Attorney, Agent, or Firm* — Slater Matsil, LLP

(57) ABSTRACT

A negative feedback inductor and a gate inductor are formed in different wiring layers of a substrate so as to be at least partially overlapped with each other in a plan view. When the lower wiring layer is thinner and the upper wiring layer is thicker, the negative feedback inductor Lc is formed in the lower wiring layer that is thinner.

14 Claims, 18 Drawing Sheets

(56) References Cited

OTHER PUBLICATIONS

Ghasemi et al., "A Low Power Transimpedance Amplifier Using Inductive Feedback approach in 90nm CMOS," IEEE International Symposium, 2009, pp. 1937-1940. As discussed in specification.

* cited by examiner

PRIOR ART

PRIOR ART

TRANSIMPEDANCE AMPLIFIER

CROSS-REFERENCE TO RELATED APPLICATIONS

This application is a national phase entry of PCT Application No. PCT/JP2019/041059, filed on Oct. 18, 2019, which claims priority to Japanese Application No. 2018-207228, filed on Nov. 2, 2018, which applications are hereby incorporated herein by reference.

TECHNICAL FIELD

The present invention relates to a transimpedance amplifier used for performing current-voltage conversion and amplification on a current signal.

BACKGROUND

Conventionally, in a transimpedance amplifier (TIA) used for performing current-voltage conversion and amplification on a current signal, a negative feedback resistor is provided in a grounded-source amplifier circuit.

FIG. 17 shows the main portion of a TIA 200 that employs a grounded-source amplifier circuit. In this TIA 200, one end of a negative feedback resistor R is connected to the drain of an n-channel MOS transistor Mn whose source is grounded, and an inductor Lc (hereinafter, called a negative feedback inductor) is connected between the other end of the negative feedback resistor R and a current signal input line Lin. Also, an inductor Lb (hereinafter, called a gate inductor) is connected between the gate of the n-channel MOS transistor Mn and the current signal input line Lin. In this TIA 200, inductor peaking occurs due to the negative feedback inductor Lc connected in front of the negative feedback resistor R and the gate inductor Lb connected in front of the gate of the n-channel MOS transistor Mn, thus extending the bandwidth.

Note that a method for causing inductor peaking to occur by connecting a negative feedback inductor in front of a negative feedback resistor is disclosed in NPL 1, for example. Also, NPL 2 discloses a method for causing inductor peaking to occur by connecting a gate inductor in front of a gate.

CITATION LIST

Non Patent Literature

NPL 1 Ghasemi, Omidreza, Rabin Raut, and Glenn Cowan. "A low power Transimpedance Amplifier using inductive feedback approach in 90 nm CMOS." Circuits and Systems, 2009. ISCAS 2009. IEEE International Symposium on. IEEE, 2009.

NPL 2 Chao, Shih-Fong, et al. "A DC-11.5 GHz low-power, wideband amplifier using splitting-load inductive peaking technique." IEEE Microwave and wireless components letters 18.7 (2008): 482-484.

SUMMARY

Technical Problem

However, as shown by the plan view in FIG. 18A and the cross-sectional view in FIG. 18B taken along line I-I in FIG. 18A, the negative feedback inductor Lc and the gate inductor Lb of the conventional TIA 200 are formed adjacent to each other on a substrate 2.

In this case, the parasitic capacitance that is formed between the side face of the negative feedback inductor Lc and the side face of the gate inductor Lb needs to be reduced, thus making it is necessary to increase the distance between the negative feedback inductor Lc and the gate inductor Lb (the value of the parasitic capacitance is inversely proportional to the distance between conductors), but this increases the occupied area on the substrate 2, and it has been difficult to realize a reduction in surface area.

Embodiments of the present invention were achieved in order to solve such issues, and an object of embodiments of the present invention is to provide a transimpedance amplifier that can realize a reduction in surface area.

Means for Solving the Problem

An aspect of embodiments of the present invention for achieving the aforementioned object is a transimpedance amplifier including: a MOS transistor (Mn); a resistor (R: negative feedback resistor) having one end connected to a drain of the MOS transistor; a first inductor (Lc: negative feedback inductor) connected between another end of the resistor and a current signal input line (Lin); a second inductor (Lb: gate inductor) connected between a gate of the MOS transistor and the current signal input line (Lin); and a substrate (1) in which the first inductor and the second inductor are formed, wherein the substrate includes a plurality of wiring layers (S1, S2) in a thickness direction, and the first inductor and the second inductor are formed in different wiring layers among the plurality of wiring layers so as to be at least partially overlapped with each other in a plan view.

In examples of configurations of embodiments of the present invention, the first inductor (negative feedback inductor) may be formed in a wiring layer that is thicker than the wiring layer in which the second inductor (gate inductor) is formed, the first inductor and the second inductor may be provided so as to generate magnetic fields that reinforce each other, and the first inductor and the second inductor may be multilayer inductors.

Note that the reference signs in parentheses in the above description denote examples of constituent elements in the drawings that correspond to the constituent elements of embodiments of the invention.

Effects of the Invention

As described above, according to embodiments of the present invention, the first inductor (negative feedback inductor) and the second inductor (gate inductor) are formed so as to be at least partially overlapped with each other in a plan view in different wiring layers of a substrate that has multiple wiring layers in the thickness direction, thus making it possible to reduce the occupied area on the substrate and realize a reduction in surface area.

DETAILED DESCRIPTION OF ILLUSTRATIVE EMBODIMENTS

The following describes embodiments of the present invention in detail with reference to the drawings.

First Embodiment

Figure 1:
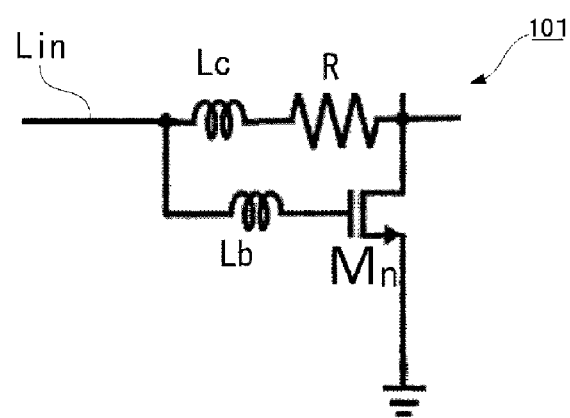
FIG. 1 is a diagram showing a main circuit of a TIA according to a first embodiment of the present invention.
Figure 2A:
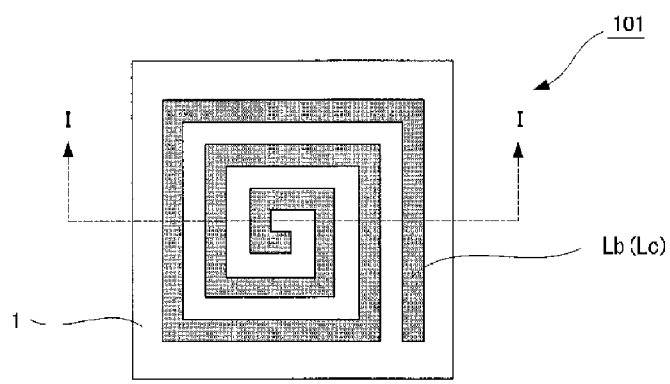
FIG. 2A is a diagram showing an example of a negative feedback inductor and a gate inductor formed in the TIA according to the first embodiment of the present invention.
Figure 2B:
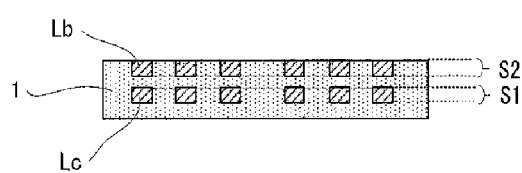
FIG. 2B is a cross-sectional view of the example of the negative feedback inductor and the gate inductor formed in the TIA according to the first embodiment of the present invention, taken along a line I-I in FIG. 2A.
Figure 17:
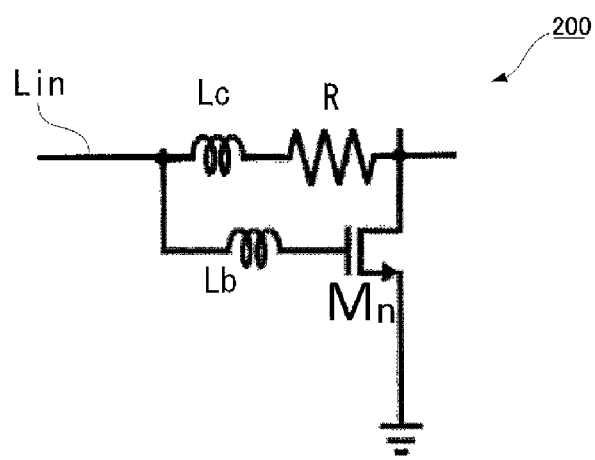
FIG. 17 shows the main portion of a TIA that employs a grounded-source amplifier circuit.
Figure 18A:
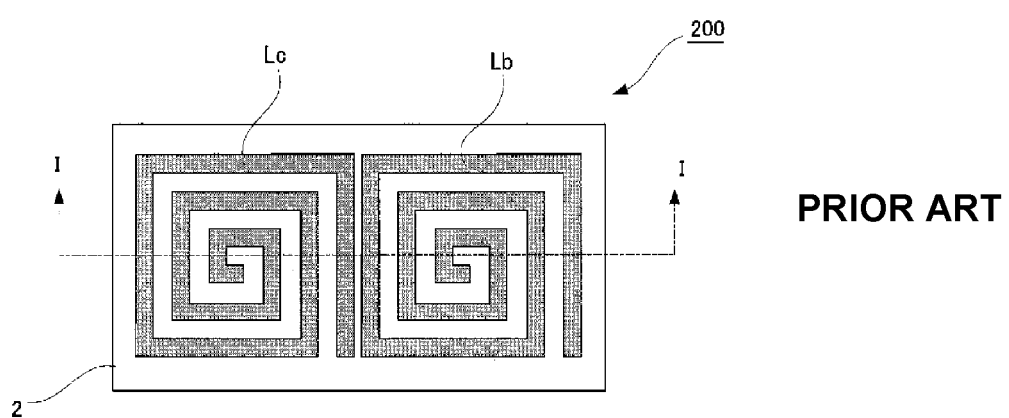
FIG. 18A is a plan view of an example of the conventional formation of a negative feedback inductor and a gate inductor.
Figure 18B:
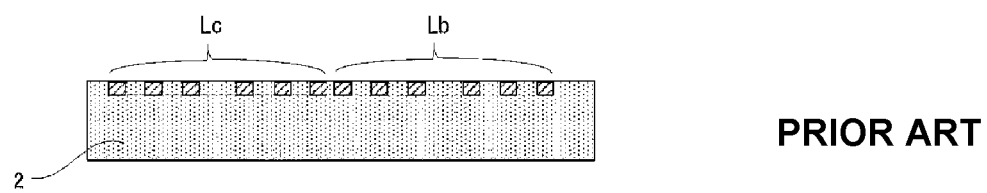
FIG. 18B is a cross-sectional view of the example of the conventional formation of a negative feedback inductor and a gate inductor.

FIG. 1 is a circuit diagram of the main portion of a TIA 101 according to a first embodiment of the present invention, and FIGS. 2A and 2B show an example of a negative feedback inductor Lc and a gate inductor Lb formed in the TIA 101 according to the first embodiment of the present invention. Note that in FIG. 1, constituent elements that are the same as those described with reference to FIG. 17 are denoted by the same reference numbers and will not be described.

In this TIA 101, the negative feedback inductor (first inductor) Lc is formed in a lower wiring layer S1 of a substrate 1, which includes two wiring layers S1 and S2 in the thickness direction, and the gate inductor (second inductor) Lb is formed in the upper wiring layer S2.

In this example, the wiring layers S1 and S2 have the same thickness. Also, the negative feedback inductor Lc and the gate inductor Lb have a spiral planar shape and are formed so as to be entirely overlapped with each other. Specifically, the negative feedback inductor Lc and the gate inductor Lb are formed in the different wiring layers S1 and S2 of the substrate 1 so as to be entirely overlapped with each other in a plan view.

Because the negative feedback inductor Lc and the gate inductor Lb of this TIA 101 are formed in the different wiring layers S1 and S2 and are entirely overlapped with each other in a plan view, the occupied area of the substrate 1 decreases, and a reduction in surface area is realized. Also, because the negative feedback inductor Lc and the gate inductor Lb are separated in the thickness direction of the substrate 1, the formation of parasitic capacitance is small.

Note that, in the TIA 101 of the first embodiment, the negative feedback inductor Lc is formed in the lower wiring layer S1 and the gate inductor Lb is formed in the upper wiring layer S2, but a configuration is possible in which the gate inductor Lb is formed in the lower wiring layer S1, and the negative feedback inductor Lc is formed in the upper wiring layer S2. Also, the negative feedback inductor Lc and the gate inductor Lb are not necessarily required to be entirely overlapped with each other, and need only be at least partially overlapped with each other.

Second Embodiment

Figure 3A:
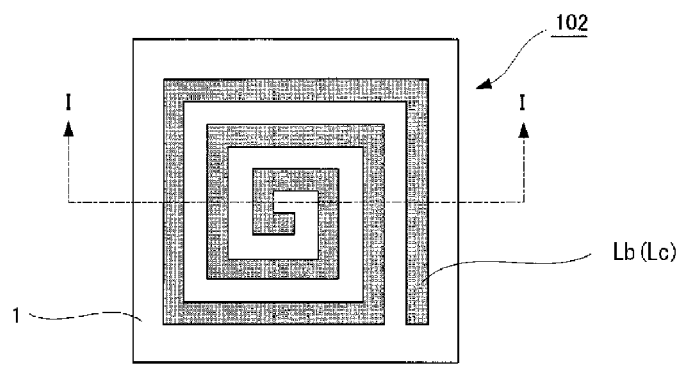
FIG. 3A is a diagram showing an example of a negative feedback inductor and a gate inductor formed in a TIA according to a second embodiment of the present invention.
Figure 3B:
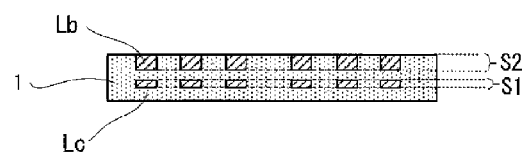
FIG. 3B is a cross-sectional view of the example of the negative feedback inductor and the gate inductor formed in the TIA according to the second embodiment of the present invention, taken along a line I-I in FIG. 3A.

FIGS. 3A and 3B show an example of the negative feedback inductor Lc and the gate inductor Lb formed in a TIA 102 according to a second embodiment of the present invention. In these figures, constituent elements that are the same as those described with reference to FIGS. 2A and 2B are denoted by the same reference numbers and will not be described.

In this TIA 102, the lower wiring layer S1 is thinner than the upper wiring layer S2, the negative feedback inductor Lc is formed in the thinner lower wiring layer S1, and the gate inductor Lb is formed in the thicker upper wiring layer S2.

In the thinner lower wiring layer S1 of this TIA 102, the path for the flow of current is small, and therefore the parasitic resistance increases. In the thicker upper wiring layer S2, the path for the flow of current is large, and therefore the parasitic resistance decreases. The negative feedback resistor R is connected behind the negative feedback inductor Lc formed in the lower wiring layer S1 (see FIG. 1), and therefore the influence of parasitic resistance in the lower wiring layer S1 can be reduced by lowering the negative feedback resistor R by design.

Third Embodiment

Figure 4A:
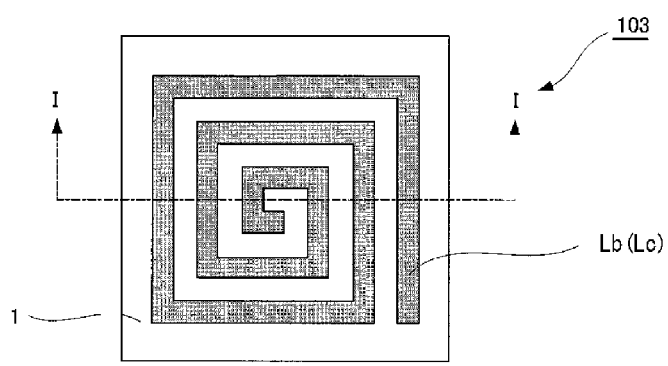
FIG. 4A is a diagram showing an example of a negative feedback inductor and a gate inductor formed in a TIA according to a third embodiment of the present invention.
Figure 4B:
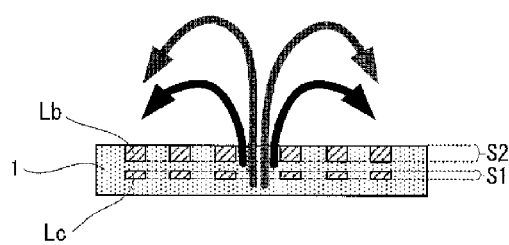
FIG. 4B is a cross-sectional view of the example of the negative feedback inductor and the gate inductor formed in the TIA according to the third embodiment of the present invention, taken along a line I-I in FIG. 4A.

FIGS. 4A and 4B show an example of the negative feedback inductor Lc and the gate inductor Lb formed in a TIA 103 according to a third embodiment of the present invention. In these figures, constituent elements that are the same as those described with reference to FIGS. 3A and 3B are denoted by the same reference numbers and will not be described.

In this TIA 103, the negative feedback inductor Lc and the gate inductor Lb are provided so as to generate magnetic fields that reinforce each other. In other words, the negative feedback inductor Lc and the gate inductor Lb have the same winding direction.

Accordingly, mutual induction occurs between the negative feedback inductor Lc and the gate inductor Lb that are arranged close to each other, the inductance per unit of area increases, and a further reduction in surface area can be realized by reducing the diameter and number of turns of the negative feedback inductor Lc and the gate inductor Lb.

Fourth Embodiment

Figure 5A:
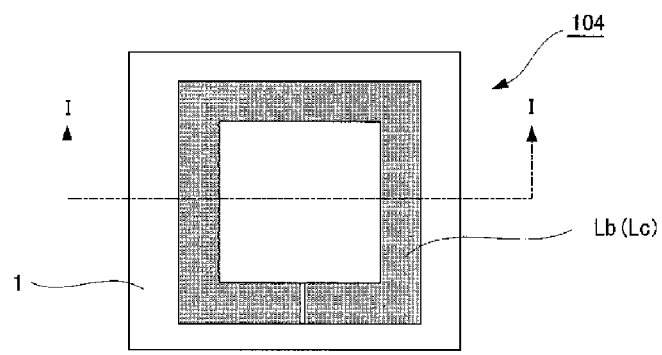
FIG. 5A is a diagram showing an example of a negative feedback inductor and a gate inductor formed in a TIA according to a fourth embodiment of the present invention.
Figure 5B:
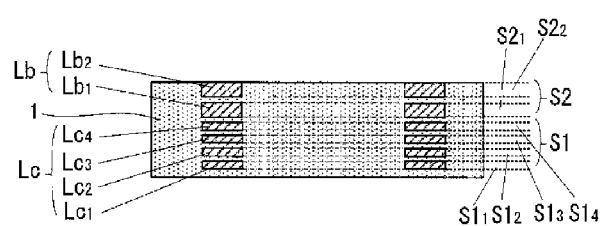
FIG. 5B is a cross-sectional view of the example of the negative feedback inductor and the gate inductor formed in the TIA according to the fourth embodiment of the present invention, taken along a line I-I in FIG. 5A.

FIGS. 5A and 5B show an example of the negative feedback inductor Lc and the gate inductor Lb formed in a TIA 104 according to a fourth embodiment of the present invention. Note that in FIGS. 5A and 5B, for the sake of simplicity, the negative feedback inductor Lc and the gate inductor Lb are shown as being wound with a quadrangular planar shape.

Figure 6:
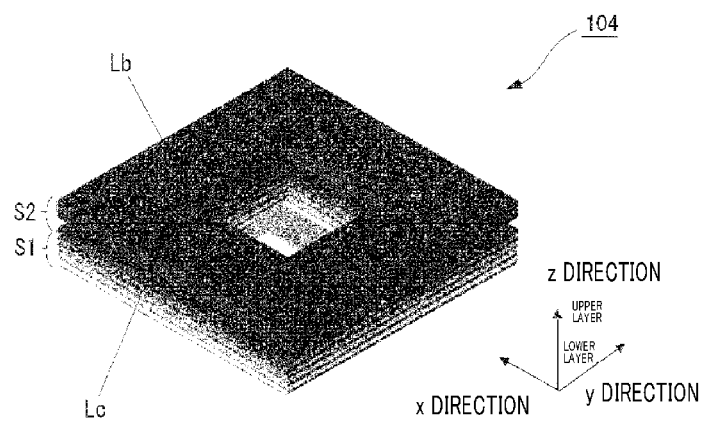
FIG. 6 is a perspective view of an example of the case where the negative feedback inductor and the gate inductor are multilayer inductors in the TIA according to the fourth embodiment of the present invention.

In this TIA 104, the negative feedback inductor Lc and the gate inductor Lb are multilayer inductors (see FIG. 6). A multilayer inductor is an inductor in which small inductors are formed in respective layers of multilayer wiring, and the inductors in the layers are interconnected by vias.

In this example, the negative feedback inductor Lc is a multilayer inductor in which the lower wiring layer S1 includes four layers $S1_1$ to $S1_4$, inductors $Lc_1$ to $Lc_4$ are formed in the layers $S1_1$ to $S1_4$, and the inductors $Lc_1$ to $Lc_4$ are interconnected by vias. Also, the gate inductor Lb is a multilayer inductor in which the upper wiring layer S2 includes two layers $S2_1$ and $S2_2$, inductors $Lb_1$ and $Lb_2$ are formed in the layers $S2_1$ and $S2_2$, and the inductors $Lb_1$ and $Lb_2$ are interconnected by vias.

Due to self-induction that occurs between layers, a multilayer inductor has a higher inductance per unit of area than a single-layer inductor. However, because the small inductors are interconnected by vias, the parasitic resistance is higher than that of a single-layer inductor. In the TIA 104 shown in FIGS. 5A and 5B, the negative feedback inductor Lc is a multilayer inductor that has four layers, and because the layers $S1_1$ to $S1_4$ are thin, the parasitic resistance in the wiring layer S1 is large, and there is a risk of signal degradation due to parasitic resistance. However, the negative feedback resistor R is connected behind the negative feedback inductor Lc (see FIG. 1), and therefore the influence of parasitic resistance in the wiring layer S1 can be reduced by lowering the negative feedback resistor R by design.

Also, in this TIA 104, the negative feedback inductor Lc and the gate inductor Lb are stacked on each other, and therefore the distance between the inductors is small, and strong mutual induction occurs. Due to this mutual induction between the inductors, the inductance per unit of area increases, thus making it possible to reduce the diameter and the number of turns of the negative feedback inductor Lc and the gate inductor Lb-n, and making it possible to realize a reduction in surface area.

Fifth Embodiment

Figure 7:
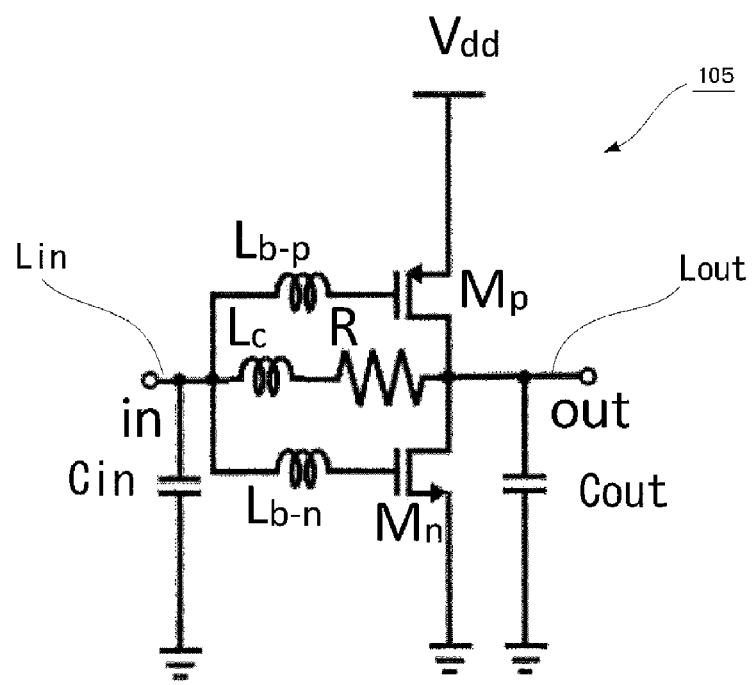
FIG. 7 is a diagram showing a main circuit of a TIA according to a fifth embodiment of the present invention.

FIG. 7 is a circuit diagram of the main portion of a TIA 105 according to a fifth embodiment of the present invention. In this TIA 105, one end of the negative feedback resistor R is connected to a connection point between the drain of an n-channel MOS transistor Mn whose source is grounded and the drain of a p-channel MOS transistor Mp whose source is connected to a power supply (positive power supply) Vdd, and the negative feedback inductor (first inductor) Lc is connected between the other end of the negative feedback resistor R and the current signal input line Lin. Also, a gate inductor (second inductor) Lb-n is connected between the gate of the n-channel MOS transistor Mn and the current signal input line Lin, and a gate inductor (third inductor) Lb-p is connected between the gate of the p-channel MOS transistor Mp and the current signal input line Lin. Note that in FIG. 7, Cin denotes the input capacitor between the input line Lin and a ground line, and Cout denotes the output capacitor between an output line Lout and the ground line.

Figure 8A:
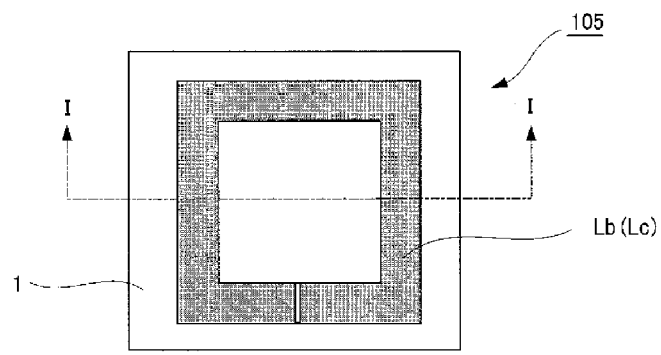
FIG. 8A is a diagram showing an example of a negative feedback inductor and gate inductors formed in the TIA according to the fifth embodiment of the present invention.
Figure 8B:
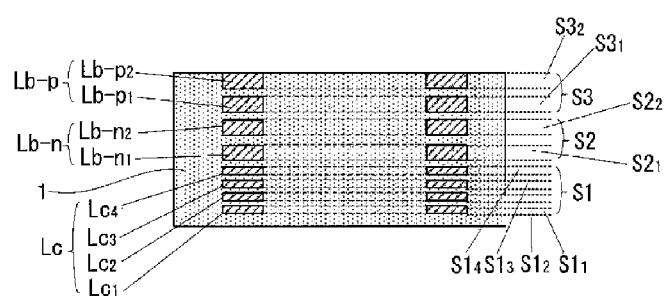
FIG. 8B is a cross-sectional view of the example of the negative feedback inductor and the gate inductors formed in the TIA according to the fifth embodiment of the present invention, taken along a line I-I in FIG. 8A.

FIGS. 8A and 8B show an example of the negative feedback inductor Lc and the gate inductors Lb-n and Lb-p formed in the TIA 105. In this TIA 105, the negative feedback inductor Lc is a multilayer inductor in which the lower wiring layer S1 includes four layers $S1_1$ to $S1_4$, inductors $Lc_1$ to $Lc_4$ are formed in the layers $S1_1$ to $S1_4$, and the inductors $Lc_1$ to $Lc_4$ are interconnected by vias. Also, the gate inductor Lb-n is a multilayer inductor in which the upper wiring layer S2 includes two layers $S2_1$ and $S2_2$, inductors $Lb-n_1$ and $Lb-n_2$ are formed in the layers $S2_1$ and $S2_2$, and the inductors $Lb-n_1$ and $Lb-n_2$ are interconnected by vias. The gate inductor Lb-p is a multilayer inductor in which a wiring layer S3 above the wiring layer S2 includes two layers $S3_1$ and $S3_2$, inductors $Lb-p_1$ and $Lb-p_2$ are formed in the layers $S3_1$ and $S3_2$, and the inductors $Lb-p_1$ and $Lb-p_2$ are interconnect by vias.

Negative Feedback Inductor

Figure 9:
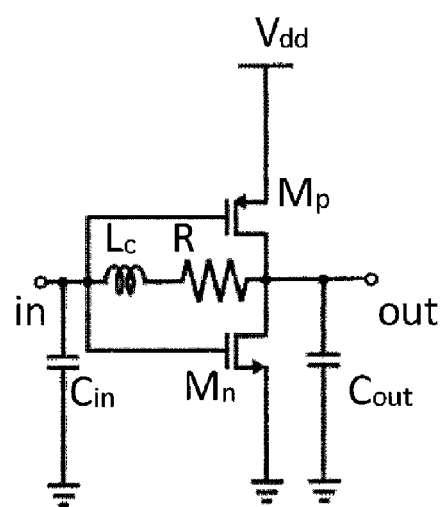
FIG. 9 is a diagram showing a circuit in which the gate inductors have been removed from the TIA shown in FIG. 7.

FIG. 9 shows a circuit in which the gate inductors Lb-n and Lb-p have been removed from the TIA 105 shown in FIG. 7. For simplicity, FIG. 10 shows an equivalent circuit of the n-channel MOS transistor Mn, and FIG. 11 shows an equivalent circuit of the case where the elements on the p-channel MOS transistor Mp side have been removed from the circuit shown in FIG. 9.

Figure 10:
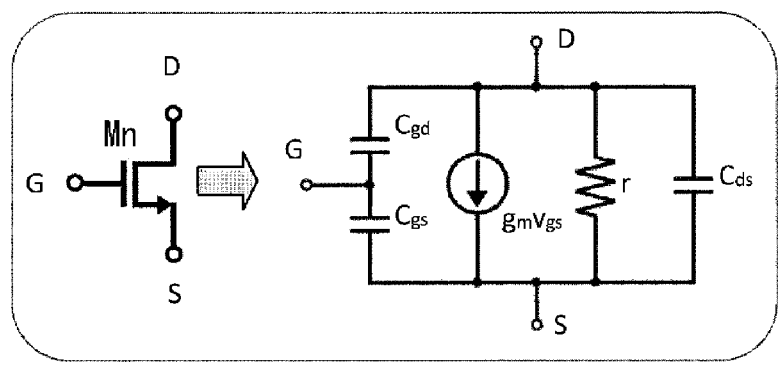
FIG. 10 is an equivalent circuit diagram of an n-channel MOS transistor Mn.

Note that in the equivalent circuit of the n-channel MOS transistor Mn shown in FIG. 10, gmVgs denotes the current supply, r denotes an internal resistor, Cgd denotes a capacitor between the gate and the drain, Cgs denotes a capacitor between the gate and the source, and Cds denotes a capacitor between the drain and the source.

Figure 11:
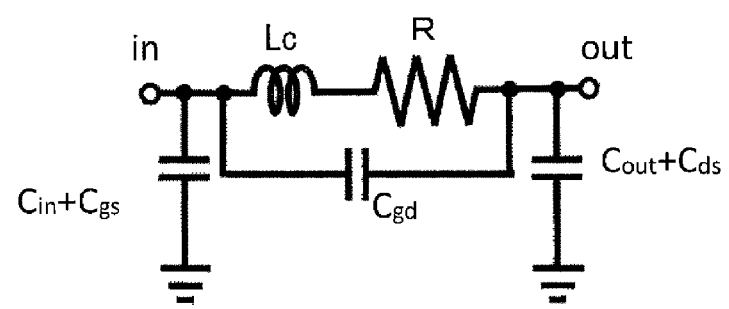
FIG. 11 is an equivalent circuit diagram of the case where elements on a p-channel MOS transistor Mp side have been removed from the circuit shown in FIG. 9.

As can be understood from the equivalent circuit shown in FIG. 11, the negative feedback inductor Lc and the capacitor Cgd resonate in parallel, and the impedance increases at the resonance frequency, and therefore gain peaking occurs. Due to the negative feedback inductor Lc being a multilayer inductor that has a large parasitic resistance but a small surface area, it is possible to achieve both a reduction in surface area and a wide bandwidth. Also, due to incorporating the negative feedback inductor Lc in the feedback path and causing gain peaking to occur, it is possible to extend the gain cutoff frequency. Moreover, peaking can occur smoothly because the multilayer inductor has a small Q value due to the parasitic resistance, and, in comparison with the case of causing peaking to occur in a single-layer inductor (an inductor having a high Q value), the bandwidth can be extended without impairing gain flatness in the bandwidth. Also, due to using a multilayer inductor, a reduction in surface area is easy to achieve.

Gate Inductor

Figure 12:
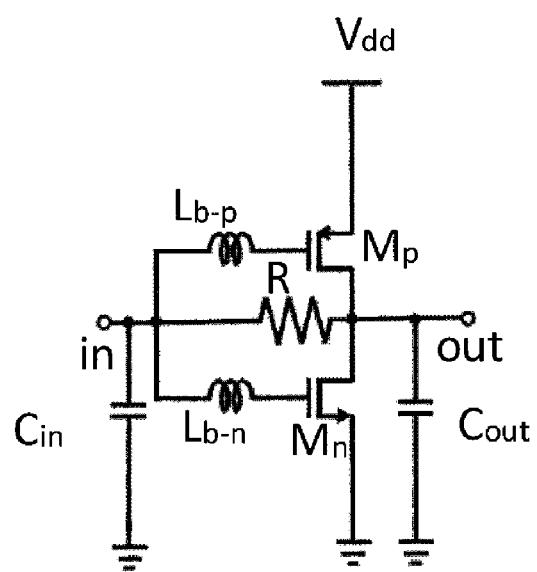
FIG. 12 is a diagram showing a circuit in which the negative feedback inductor has been removed from the TIA shown in FIG. 7.

FIG. 12 shows a circuit in which the negative feedback inductor Lc has been removed from the TIA 105 shown in FIG. 7. Here, for simplicity, FIG. 10 shows an equivalent circuit of the n-channel MOS transistor Mn, and FIG. 13 shows an equivalent circuit of the case of omitting the elements on the p-channel MOS transistor Mp side.

Figure 13:
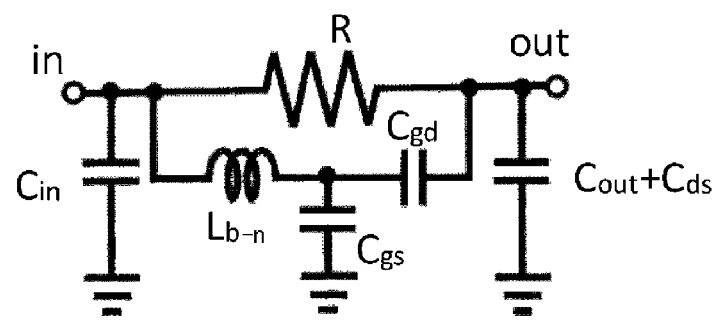
FIG. 13 is an equivalent circuit diagram of the case where elements on the p-channel MOS transistor side have been removed from the circuit shown in FIG. 12.

As can be understood from the equivalent circuit shown in FIG. 13, the gate inductor Lb-n and the capacitor Cgd resonate in series, and the impedance decreases at the resonance frequency, and therefore gain peaking occurs. Gain peaking similarly occurs on the gate inductor Lb-p side as well. Due to the gate inductors Lb-n and Lb-p being multilayer inductors that have a large parasitic resistance but a small surface area, it is possible to achieve both a reduction in surface area and a wide bandwidth. Also, due to incorporating the gate inductors Lb-n and Lb-p in the input path and causing gain peaking to occur, it is possible to extend the gain cutoff frequency. Moreover, due to using a multilayer inductor, a reduction in surface area is easy to achieve.

Sixth Embodiment

Figure 14:
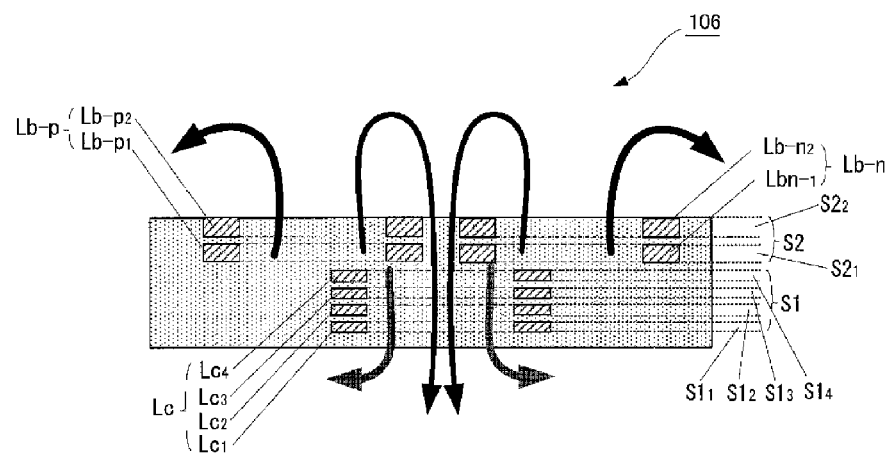
FIG. 14 is a diagram showing an example of a negative feedback inductor and gate inductors formed in a TIA according to a sixth embodiment of the present invention.

FIG. 14 is a diagram showing an example of the negative feedback inductor Lc and the gate inductors Lb-n and Lb-p formed in a TIA 106 according to a sixth embodiment of the present invention.

In this TIA 106, the negative feedback inductor Lc is formed in the lower wiring layer S1, and the gate inductor Lb-n and the gate inductor Lb-p are formed in the upper wiring layer S2. In other words, the gate inductor Lb-n and the gate inductor Lb-p are formed adjacent to each other in the same wiring layer S2.

Figure 15:
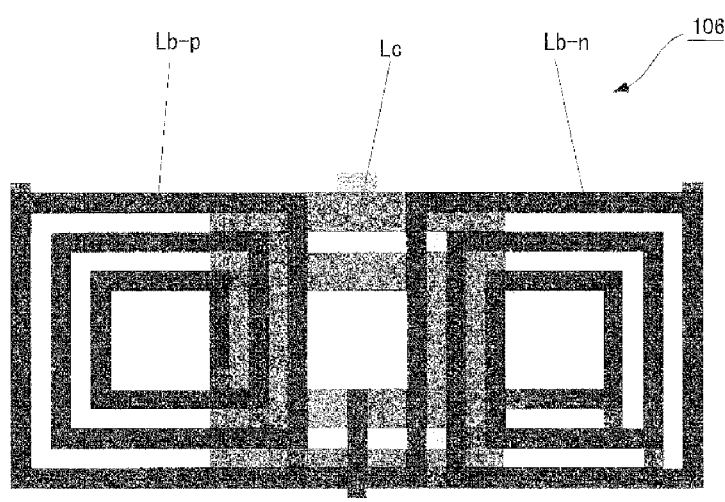
FIG. 15 is a plan view of an example of the case where the negative feedback inductor and the gate inductors are multilayer inductors in the TIA according to the sixth embodiment of the present invention.
Figure 16:
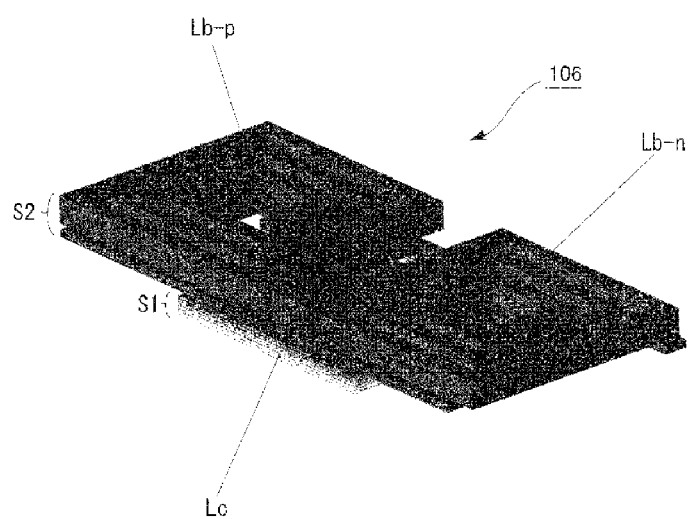
FIG. 16 is a perspective view of an example of the case where the negative feedback inductor and the gate inductors are multilayer inductors in the TIA according to the sixth embodiment of the present invention.

Also, in this TIA 106, the negative feedback inductor Lc and the gate inductors Lb-n and Lb-p are multilayer inductors. For reference, this TIA is shown in a plan view in FIG. 15 and in a perspective view in FIG. 16.

Also, in this TIA 106, in order for the negative feedback inductor Lc and the gate inductors Lb-p and Lp-n to generate magnetic fields that reinforce each other, the winding direction of the negative feedback inductor Lc and the winding direction of the gate inductors Lb-p and Lp-n are set opposite to each other.

Also, in this TIA 106, in order to minimize the parasitic capacitance between wiring on the sides where the negative feedback inductor Lc is overlapped with the gate inductors Lb-p and Lp-n, the circuit is designed such that the wiring positions are not directly above each other, and the wiring widths are reduced.

Variations

Although the present invention has been described with reference to the above embodiments, the present invention is not limited to the above embodiments. Various changes understandable to a person skilled in the art can be made to the configurations and details of the present invention within the scope of the technical idea of the present invention.

REFERENCE SIGNS LIST

1 Substrate
S1, S2, S3 Wiring layer
Mn n-channel MOS transistor
Mp p-channel MOS transistor
R Negative feedback resistor
Lc Negative feedback inductor
Lb, Lb-n, Lb-p Gate inductor
Lin Current signal input line
101 to 106 Transimpedance amplifier (TIA).

The invention claimed is:

1. A transimpedance amplifier comprising:
   a MOS transistor;
   a resistor having a first end connected to a drain of the MOS transistor;
   a first inductor having a first end connected to a second end of the resistor, and wherein a second end of the first inductor is directly connected to a current signal input line;
   a second inductor having a first end connected to a gate of the MOS transistor, and wherein a second end of the second inductor is directly connected to the current signal input line;
   a substrate on which the first inductor and the second inductor are disposed; and
   a plurality of wiring layers over the substrate, wherein the first inductor and the second inductor are disposed in different wiring layers of the plurality of wiring layers so as to be at least partially overlapped with each other in a plan view.

2. The transimpedance amplifier according to claim 1, wherein the first inductor is disposed in a first wiring layer of the plurality of wiring layers, wherein the second inductor is disposed in a second wiring layer of the plurality of wiring layers, and wherein the first wiring layer that is thinner than the second wiring layer.

3. The transimpedance amplifier according to claim 1, wherein the first inductor and the second inductor are arranged so as to generate magnetic fields that reinforce each other.

4. The transimpedance amplifier according to claim 1, wherein the first inductor is a first multilayer inductor that includes a plurality of first inductors in layers of the plurality of wiring layers and connected to each other.

5. The transimpedance amplifier according to claim 4, wherein the second inductor is a second multilayer inductor that includes a plurality of second inductors in layers of the plurality of wiring layers and connected to each other.

6. A transimpedance amplifier comprising:
   a first MOS transistor having a first source that is grounded;
   a second MOS transistor having a second source connected to a power supply;
   a resistor having a first end connected to a connection point between a first drain of the first MOS transistor and a second drain of the second MOS transistor;
   a first inductor connected between a second end of the resistor and a current signal input line;
   a second inductor connected between a first gate of the first MOS transistor and the current signal input line;

a third inductor connected between a second gate of the second MOS transistor and the current signal input line;

a substrate on which the first inductor, the second inductor, and the third inductor are disposed; and a plurality of wiring layers over the substrate, wherein the first inductor, the second inductor, and the third inductor are disposed in different wiring layers of the plurality of wiring layers such that the first inductor is at least partially overlapped with the second inductor and the third inductor in a plan view.

7. The transimpedance amplifier according to claim 6, wherein the first inductor is disposed in a first wiring layer that is thinner than a second wiring layer in which the second inductor or the third inductor are disposed.

8. The transimpedance amplifier according to claim 7, wherein the second inductor and the third inductor are both disposed in the second wiring layer.

9. The transimpedance amplifier according to claim 6, wherein the first inductor, the second inductor, and the third inductor are each a multilayer inductor that includes a plurality of inductors that are disposed in layers of the plurality of wiring layers and are connected to each other.

10. A method comprising:
forming a MOS transistor at a top surface of a substrate; and
forming a plurality of wiring layers over the substrate, the plurality of wiring layers comprising:
a resistor having a first end connected to a drain of the MOS transistor;
a first inductor having a first end connected to a second end of the resistor, and wherein a second end of the first inductor is directly connected to a current signal input line; and
a second inductor having a first end connected to a gate of the MOS transistor, and wherein a second end of the second inductor is directly connected to the current signal input line, wherein the first inductor and the second inductor are disposed in different wiring layers of the plurality of wiring layers, and wherein the first inductor at least partially overlaps the second inductor in in a plan view.

11. The method according to claim 10, wherein the first inductor is disposed in a first wiring layer of the plurality of wiring layers, wherein the second inductor is disposed in a second wiring layer of the plurality of wiring layers, and wherein the first wiring layer that is thinner than the second wiring layer.

12. The method according to claim 10, wherein the first inductor and the second inductor are arranged so as to generate magnetic fields that reinforce each other.

13. The method according to claim 10, wherein the first inductor is a first multilayer inductor that includes a plurality of first inductors in layers of the plurality of wiring layers and connected to each other.

14. The method according to claim 13, wherein the second inductor is a second multilayer inductor that includes a plurality of second inductors in layers of the plurality of wiring layers and connected to each other.

\* \* \* \* \*